United States Patent [19]
Gruber et al.

[11] Patent Number: 4,936,930
[45] Date of Patent: Jun. 26, 1990

[54] METHOD FOR IMPROVED ALIGNMENT FOR SEMICONDUCTOR DEVICES WITH BURIED LAYERS

[75] Inventors: Gilbert A. Gruber, San Jose; Zolik Fichtenholz, Campbell, both of Calif.

[73] Assignee: Siliconix incorporated, Santa Clara, Calif.

[21] Appl. No.: 141,877

[22] Filed: Jan. 6, 1988

[51] Int. Cl.$^5$ ................. H01L 29/12; H01L 29/30
[52] U.S. Cl. ................. 148/33.4; 148/DIG. 102; 148/33.2; 437/90; 437/924
[58] Field of Search ............... 437/924, 8, 89, 90; 148/DIG. 50, 102, 33-33.4; 156/644, 662

[56] References Cited

U.S. PATENT DOCUMENTS

| | | | |
|---|---|---|---|
| 4,125,418 | 11/1978 | Vinton | 437/8 |
| 4,256,829 | 3/1987 | Daniel | 437/153 |
| 4,503,334 | 3/1985 | King et al. | 250/491.1 |
| 4,572,765 | 2/1986 | Berry | 437/20 |
| 4,639,798 | 1/1987 | Drake et al. | 156/662 |

FOREIGN PATENT DOCUMENTS

| | | |
|---|---|---|
| 0160443 | 12/1980 | Japan . |
| 0102523 | 6/1983 | Japan . |
| 0106545 | 6/1983 | Japan . |
| 0039041 | 3/1984 | Japan . |
| 0048711 | 3/1984 | Japan . |
| 0123083 | 6/1986 | Japan . |
| 0174764 | 8/1986 | Japan . |

OTHER PUBLICATIONS

Ghandhi, *VLSI Fabrication Principles*, John Wiley & Sons, New York, 1986, pp. 475-517.

*Primary Examiner*—Brian E. Hearn
*Assistant Examiner*—William Bunch
*Attorney, Agent, or Firm*—Skjerven, Morrill, MacPherson, Franklin & Friel

[57] ABSTRACT

A method is provided to improve the alignment process in fabricating an integrated circuit with buried layers. The buried layers are implanted in a substrate and driven in, but without the usual step at their perimeter. A target pattern is etched into the substrate surface by means of plasma-assisted etching. An isotropic epitaxial layer is then grown at reduced pressure over the substrate surface so that the target is replicated on the epitaxial layer surface. The target as replicated is thus suitable for optical alignment, either manually or by automatic alignment equipment.

7 Claims, 3 Drawing Sheets

FIG. 1 (d) (Prior Art)

METHOD FOR IMPROVED ALIGNMENT FOR SEMICONDUCTOR DEVICES WITH BURIED LAYERS

BACKGROUND OF THE INVENTION

1. Field of the Invention

This invention relates to methods for improving the mask alignment in the fabrication of semiconductor integrated circuits that contain buried layers.

2. Description of the Prior Art

Many semiconductor integrated circuit technologies, including bipolar, JFET, CMOS and VMOS use buried layers. A buried layer is a semiconductor region in a substrate which is then covered by an epitaxial layer. Hence the buried layer is a region buried under the epitaxial layer. Each semiconductor device, as needed, may have its own buried layer.

For instance, the following steps are now known in the art to fabricate a buried layer integrated circuit, as shown in FIG. 1.

Starting with a silicon substrate 1 as shown in FIG. 1(a), its surface is oxidized to form a silicon dioxide layer 3 covering the principal surface of the substrate 1. Using conventional photoresist and masking methods, a window 5 is opened in the oxide layer 3. This window defines the location of the buried layer. Then, as shown in FIG. 1(b), the desired dopant is ion implanted through the window 5, to form buried layer 7. Then, as shown in FIG. 1(c), dopants are driven into buried layer 7 in an oxidizing ambient. Because of the different rates of oxidation between the exposed buried layer 7 and the surrounding silicon dioxide-covered area 3 during drive-in, a step 8 forms on the surface of the periphery of the buried layer 7. That is, the buried layer 7 is depressed below the surface of the substrate. This process is disclosed, for instance, in the textbook VLSI Technology, edited by S. M. Sze, McGraw-Hill, 1983, pages 51-53, 68-70.

It is important that the subsequent masking process be properly aligned with the buried layer 7. To achieve this, the depressed buried layer 7 must have a well defined edge with "step" 8 typically 0.05 to $0.1\mu$ (500 to 1000Å) high around its perimeter formed by differential oxidation. This perimeter "step" 8 marks the location of the buried layer 7 and is the result of the oxidation during the drive-in of the buried layer dopants.

The remaining oxide layer 3 is stripped off and the epitaxial layer 9 as shown in FIG. 1(d) is now grown on the surface of the substrate 1, over the buried layer 7. Since the epitaxial layer 9 is typically about $5\mu$ thick (equal to 50,000Å), the perimeter step 8 propagates through to the top surface of the epitaxial layer 9. Unfortunately, due to anisotropy, when the epitaxial layer is grown, the perimeter step is both shifted by distance x and distorted to an elongated shape shown in FIG. 1(f) (a top view along line f—f in FIG. 1(d)) relative to its original configuration shown in FIG. 1(e) (a top view along line e—e in FIG. 1(d)) in the substrate.

The shift and distortion complicate alignment of the subsequent mask. Specifically, the shift in location must be corrected for, and the distortion in the pattern shape makes recognition of the pattern difficult. Therefore, alignment requires a skilled human operator who can recognize the distorted perimeter step pattern, plus the complication of adjusting for shift. This obviates the use of automatic optical alignment equipment, and so makes processing slower and more expensive.

One improvement known in the art is to modify the epitaxial process. By growing the epitaxial layer at reduced pressure (lower than the usual atmospheric pressure), isotropic growth of the epitaxial crystal layer eliminates the distortion and shift. However, even with this improvement, it is still necessary to employ differential oxidation to drive-in the buried layer so that it includes a perimeter step and even then, current automatic alignment equipment does not readily recognize the rectangular step pattern.

Therefore, traditional prior art involves a buried layer step and anisotropic epitaxial growth. This produces a shifted and distorted step pattern, which is not recognizable by automatic alignment equipment, and which requires significant skill even of a human operator to recognize and correct for shift. The improved prior art would involve a buried layer step and isotropic epitaxial growth. This eliminates shift and distortion, but the rectangular step pattern still is not readily recognizable by automatic alignment equipment, and still requires a fairly skilled human operator.

It would be highly desirable to alter the process to eliminate the need for forming the perimeter step, and also make the process suitable for optical automatic alignment equipment such as projection aligners and steppers by creating a pattern easily recognized by such automatic equipment.

SUMMARY

A process for aligning the masks of a semiconductor integrated circuit with buried layers in accordance with the present invention includes the steps of oxidizing the wafer, opening buried layer windows, and ion implanting and driving in the buried layer dopant. The new step is then, using plasma-assisted etching, to etch an "X" pattern called a target into the substrate. Alternatively, the target could be etched at the same time the buried layers are formed This "X" pattern is such that it can be easily recognized by automatic optical alignment equipment. Then the remaining part of the oxide layer is stripped off the substrate. The epitaxial layer is now grown isotropically so that no shift or dislocation takes place, leaving a clear and precisely located mask alignment mark replicating the target on the top surface of the epitaxial layer. Therefore, the invention (1) eliminates the need to create a buried layer step; and (2) provides a target easily recognized by automatic equipment, or by a less skilled human operator.

DETAILED DESCRIPTION

Figure 1:
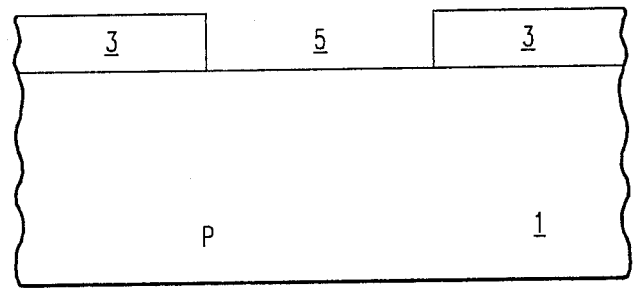
FIG. 1 (a) to (d) show a view of a prior art buried layer structure.
Figure 1:
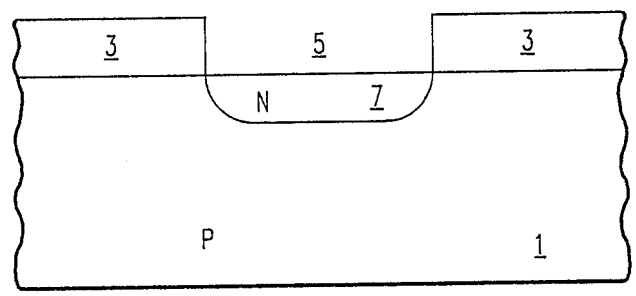
Figure 1:
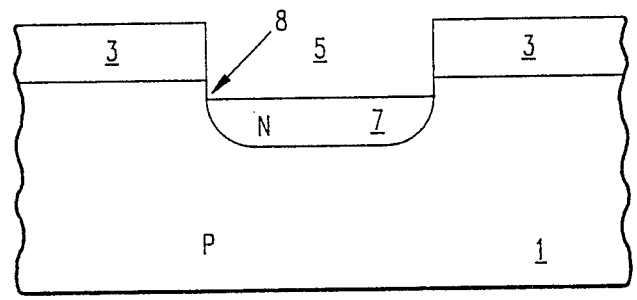
Figure 1E:
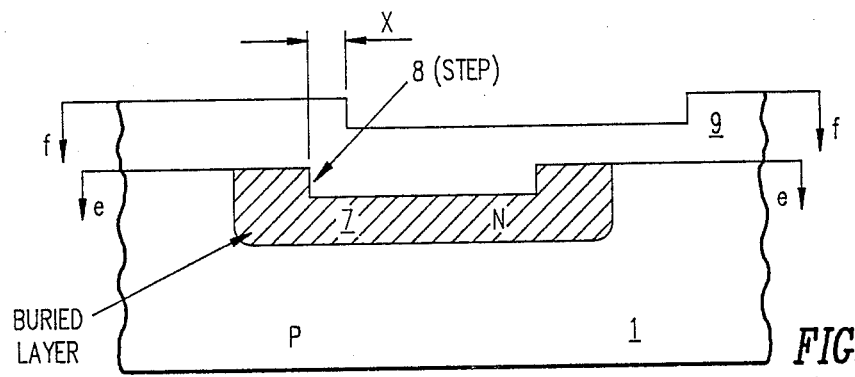
FIG. 1(e) shows a top view of the buried layer step, along line e—e in FIG. 1(d)
Figure 1E:
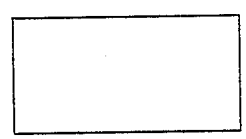
Figure 1F:
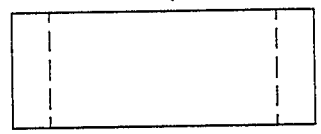
FIG. 1(f) shows distortion of the buried layer step in a top view of FIG. 1(d) along line f—f.
Figure 2:
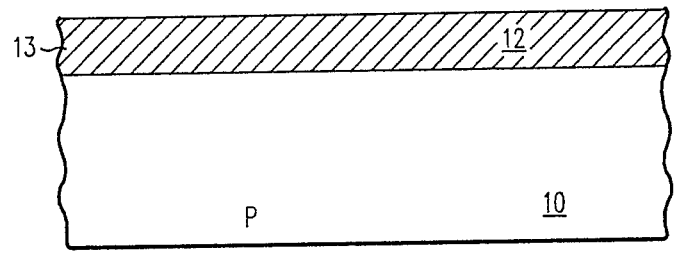
FIGS. 2 to 7 show the process steps included in the present invention.

As shown in FIG. 2, a process in accordance with the preferred embodiment of the invention for improving mask alignment in integrated circuits containing buried layers includes the step of starting with a substrate 10 (typically silicon) having a P type conductivity, doped with boron to about $10^{15}$ atoms/cm$^3$. Thereafter an oxide layer 12, in one embodiment silicon dioxide 0.3 to 0.8μ thick (3,000 to 8,000Å) is grown on the substrate's principal surface 13. The substrate typically has a [100] crystal orientation.

Figure 3:
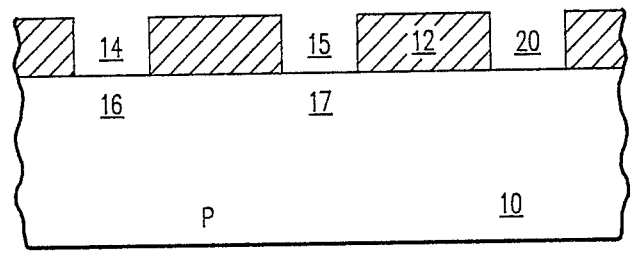

Silicon dioxide layer 12 illustrated in FIG. 3 is then masked using conventional photolithographic techniques. The exposed portion of the silicon dioxide layer 12 is then removed, for instance, by using buffered HF, thus opening buried layer windows 14 and 15, to expose the areas 16 and 17 that are to be the buried layers. By a separate mask, a window 20 is similarly opened in the silicon dioxide layer 12 for the target. The target is a pattern in the substrate surface, to be etched later.

Figure 4:
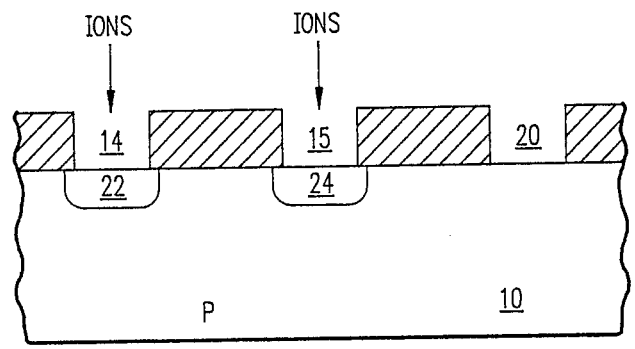

The substrate 10 is then subjected to an ion implantation process as shown in FIG. 4, in one embodiment an N type implantation using antimony or phosphorous ions to a dosage between $10^{14}$ and $2 \times 10^{15}$ ions/cm$^2$ at an energy of approximately 50 to 150 KEV, thus forming N+ regions 22 and 24 in the substrate 10. The implanted ions are then driven into the substrate by subjecting the substrate to a temperature of about 1100° C. in an oxygen atmosphere to form the buried layers 22 and 24. Each buried layer 22 and 24 is about 8μ thick, with a resistance of 20 Ω-cm.

Figure 5:
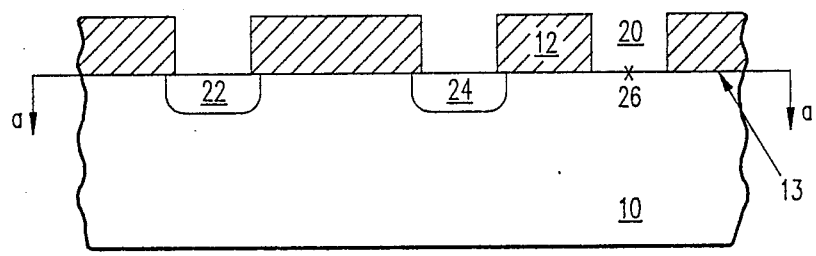
Figure 6:
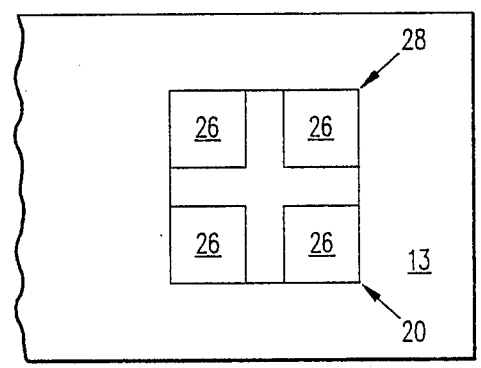
Figure 6:
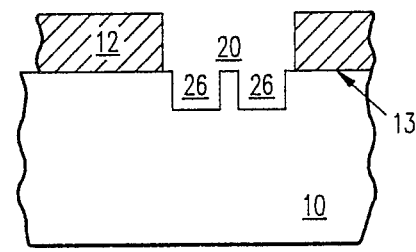

At this point as shown in FIG. 5, by means of plasma-assisted etching, in one embodiment reactive ion etching, a pattern 26 called a "target" is etched in the surface 13 of the substrate through window 20. Other embodiments would use plasma etching, reactive ion beam etching, or even wet etching. Alternatively, the target could be etched at the same time the buried layers are formed. The target 26 etched in the substrate is in one embodiment per FIG. 6(a) a top view along line a—a of FIG. 5, a rectangle 28 at its outer periphery in which the entire rectangle is etched away except for a cross (or "X") that is left standing above the bottom surface of the etched area, as shown in FIG. 6(b). FIG. 6(b) is a closeup view of the substrate 10 from the same perspective as FIGS. 2 to 5. The target is one that is easily recognizable by whatever automatic optical alignment equipment is in use, including mirror projection aligners and steppers. In the preferred embodiment, the target is the etched-away rectangle referred to above with a raised "X" left standing. The dimensions of the "X" are about 100μ long, with the lines 1 to 10μ wide, and 2μ high. Alternative target embodiments include an "X" etched as a groove in the substrate, or whatever configurations are easily recognized by the desired subsequent alignment process In the preferred embodiment, two identical targets are etched in the substrate for each step of the mask when using an automatic stepper optical aligner. This means that depending on how many die are being masked at each step of the aligner, there would be two targets per die, or two targets per 2 die, or two targets per 3 or 4 or 5 die. The two targets are spaced apart in the area for which they serve as alignment patterns. This means that there is not generally a target for each buried layer, and in fact the targets, serving as position markers, are not necessarily anywhere near any particular buried layer, but are offset from and so are located at a known position relative to the buried layers. The targets are mask alignment markers, and serve no other purpose.

Figure 7:
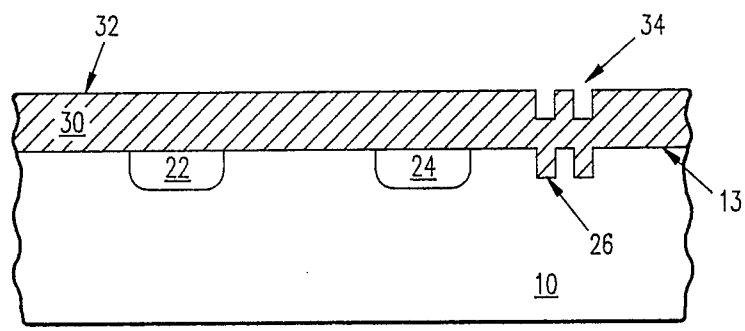

Next, the remainder of the silicon dioxide layer 12 is stripped off the substrate 10, by conventional means. Then, as shown in FIG. 7, the epitaxial layer 30 is grown on the substrate surface 13. The epitaxial layer 30 is grown isotropically on the substrate principal surface 13 so that the shift and distortion of anisotropic crystal growth do not occur, and the target is accurately replicated on the epitaxial layer surface 32 in terms of location and shape. This means that the epitaxial layer 30 is an isotropic crystal layer. In the preferred embodiment, the epitaxial layer 30 is grown at reduced pressure, typically 50 to 180 torr. Alternatively, growing the epitaxial layer at atmospheric pressure but at higher than normal temperatures can produce the desired isotropic crystal layer.

The epitaxial layer over a buried layer, in the prior art and the preferred embodiment of the present invention, is about 5μ (50,000Å) thick with a resistance of about 1 Ω-cm. The epitaxial layer is doped and is the same conductivity type as the underlying buried layer.

At this point, the remaining steps to complete the processing are as usual with optical automatic aligners, using the target 34 in the top surface 32 of the epitaxial layer 30 as an alignment marker to align with the corresponding key in the alignment equipment. Thus, the subsequent mask steps can be done with full confidence that the location of the buried layer regions 22, 24 is accurately known.

The present invention is of value also when manual alignment is used. In the prior art, the buried layer perimeter steps are used to align later masks. The need to correct for shift, and the distortion in the step patterns, mean that skilled human operators must do the alignment in order to identify the hard-to-recognize perimeter steps.

The present invention has two advantages, even without automatic alignment. (1) There is no need to form the perimeter steps; this simplifies processing of the buried layers, since differential oxidation is not needed. (2) Identification of the present invention "X" targets is easier than identifying the prior art perimeter rectangular steps, so less skill is required of the human operator.

Those skilled in the art will recognize that minor changes, in addition to the alternative embodiments disclosed above, can be made to form and detail without departing from the spirit and scope of the invention. For example, the substrate and buried layers could be of opposite polarity from that disclosed above. Depending on changes in alignment equipment, more or fewer targets can be etched per die or per wafer than in the preferred embodiment. Also, the target mask could be the same mask as used for the buried layers. Accordingly, all such changes come within the scope of the present invention as delineated by the following claims.

We claim:

1. A semiconductor device comprising:
   a semiconductor substrate of a first conductivity type, having a principal surface;
   at least one region of a second conductivity type formed in said substrate;
   at least one target etched in said principal surface, said target being located at a known position relative to the position of said region and having an outline different from that of said region; and
   an isotropic crystal layer overlying and in contact with said principal surface, wherein said target is replicated on the surface of said isotropic crystal layer.

2. The device of claim 1, further comprising said target replicated on said surface of said isotropic crystal layer being readily detectable by optical alignment equipment.

3. The device of claim 1, wherein said isotropic crystal layer is formed by epitaxial growth.

4. The device of claim 1, wherein said isotropic crystal layer is formed by low ambient pressure epitaxial growth.

5. The device of claim 1, wherein said target is etched by plasma-assisted etching.

6. The device of claim 1, wherein said target is etched by reactive ion etching.

7. The device of claim 1, wherein said target comprises an etched-away area with an X-shaped area standing inside said etched-away area.

* * * * *